(12) United States Patent
Okada (10) Patent No.: US 8,476,894 B2
(45) Date of Patent: Jul. 2, 2013

(54) MONITORING CIRCUIT, METHOD FOR OUTPUTTING MONITOR SIGNAL, AND OPTICAL RECEIVER

(75) Inventor: Hiroshi Okada, Tokyo (JP)

(73) Assignee: Fujikura Ltd., Toyko (JP)

( * ) Notice: Subject to any disclaimer, the term of this patent is extended or adjusted under 35 U.S.C. 154(b) by 437 days.

(21) Appl. No.: 12/801,051

(22) Filed: May 19, 2010

(65) Prior Publication Data

US 2010/0295538 A1    Nov. 25, 2010

(30) Foreign Application Priority Data

May 22, 2009    (JP) .................................. 2009-124665

(51) Int. Cl.
*G01R 31/00* (2006.01)
(52) U.S. Cl.
USPC ............................................................ 324/96
(58) Field of Classification Search
USPC ........... 324/96, 762.01–762.1, 754.01–754.3, 324/755.01–755.1; 257/48
See application file for complete search history.

(56) References Cited

U.S. PATENT DOCUMENTS

| | | | |
|---|---|---|---|
| 6,919,716 B1 * | 7/2005 | Buehler ........................ | 324/96 |
| 6,982,406 B2 * | 1/2006 | Chen .......................... | 250/214.1 |
| 7,555,228 B2 | 6/2009 | Ruegg et al. | |
| 2007/0023615 A1 | 2/2007 | Ruegg et al. | |
| 2007/0052405 A1 | 3/2007 | Mochizuki et al. | |

FOREIGN PATENT DOCUMENTS

| | | |
|---|---|---|
| CN | 1154601 | 7/1997 |
| CN | 1604209 | 4/2005 |
| JP | 2005-110041 | 4/2005 |
| JP | 2006-319427 | 11/2006 |
| WO | WO 2008/099507 | 8/2008 |

OTHER PUBLICATIONS

Office Action for corresponding Chinese Application No. 201010176636.3 dated Nov. 1, 2012 and English translation thereof.
Office Action for corresponding Japanese Application No. 2009-124665 dated Mar. 12, 2013 and English translation thereof.

* cited by examiner

*Primary Examiner* — Tung X Nguyen
(74) *Attorney, Agent, or Firm* — Harness, Dickey & Pierce (57) ABSTRACT

A monitoring circuit of the present invention provides a monitor signal with which a magnitude of a current flowing across a photodetector, such as a photodiode, can be calculated accurately over a wide temperature range on the basis of a value of the monitor signal. The monitoring circuit of the present invention includes: a current mirror circuit for outputting a monitor current proportional to an input current, the current mirror circuit having an input point for receiving the input current, the input point being connected to a photodetector and a load resistor, which are connected thereto in parallel; and an output circuit for outputting a monitor signal indicating a difference between a monitor electric potential proportional to the monitor current, and an offset electric potential proportional to an offset current which flows across the load resistor concurrently with the monitor current.

8 Claims, 7 Drawing Sheets

| INPUT POWER | Ta=-40°C | | | Ta=25°C | | | Ta=75°C | | |
|---|---|---|---|---|---|---|---|---|---|
| | OBSERVED VALUE | CONVERSION | SPEC | OBSERVED VALUE | CONVERSION | SPEC | OBSERVED VALUE | CONVERSION | SPEC |
| dBm | HEXADECIMAL NUMBER | dBm | ±3dB | HEXADECIMAL NUMBER | dBm | ±3dB | HEXADECIMAL NUMBER | dBm | ±3dB |
| -6 | A64 | -5.75118 | -0.249 | A71 | -5.73001 | -0.270 | AC1 | -5.60194 | -0.398 |
| -8 | 687 | -7.77024 | -0.230 | 67C | -7.79892 | -0.201 | 670 | -7.83043 | -0.170 |
| -10 | 3CD | -10.1189 | 0.119 | 3C8 | -10.1412 | 0.141 | 3F2 | -9.95679 | -0.043 |
| -12 | 249 | -12.3284 | 0.328 | 255 | -12.2403 | 0.240 | 276 | -12.0066 | 0.007 |
| -14 | 16B | -14.4009 | 0.401 | 180 | -14.1567 | 0.157 | 18A | -14.045 | 0.045 |
| -16 | D8 | -16.6555 | 0.655 | EB | -16.2893 | 0.289 | FC | -15.986 | -0.014 |
| -18 | 84 | -18.7943 | 0.794 | 92 | -18.3565 | 0.356 | A0 | -17.9588 | -0.041 |
| -20 | 55 | -20.7058 | 0.706 | 62 | -20.0877 | 0.088 | 67 | -19.8716 | -0.128 |
| -22 | 37 | -22.5964 | 0.596 | 3F | -22.0066 | 0.007 | 43 | -21.7393 | -0.261 |
| -24 | 24 | -24.437 | 0.437 | 28 | -23.9794 | -0.021 | 2B | -23.6653 | -0.335 |
| -26 | 15 | -26.7778 | 0.778 | 19 | -26.0206 | 0.021 | 1C | -25.5284 | -0.472 |
| -28 | E | -28.5387 | 0.539 | 10 | -27.9588 | -0.041 | 12 | -27.4473 | -0.553 |
| -30 | 8 | -30.9691 | 0.969 | A | -30 | 0.000 | B | -29.5861 | -0.414 |

F I G. 4

| INPUT POWER | Ta=-40°C | | | Ta=25°C | | | Ta=75°C | | |
|---|---|---|---|---|---|---|---|---|---|
| | OBSERVED VALUE | CONVERSION | SPEC | OBSERVED VALUE | CONVERSION | SPEC | OBSERVED VALUE | CONVERSION | SPEC |
| dBm | HEXADECIMAL NUMBER | dBm | ±3dBm | HEXADECIMAL NUMBER | dBm | ±3dBm | HEXADECIMAL NUMBER | dBm | ±3dBm |
| -8 | 677 | -7.81202 | -0.188 | 61F | -8.04931 | 0.049 | 53E | -8.72247 | 0.722 |
| -9 | 562 | -8.60751 | -0.392 | 4B3 | -9.19734 | 0.197 | 469 | -9.47306 | 0.473 |
| -10 | 44A | -9.59398 | -0.406 | 3B1 | -10.2457 | 0.246 | 32D | -10.8991 | 0.899 |
| -11 | 3B5 | -10.2273 | -0.773 | 316 | -11.0237 | 0.024 | 2DA | -11.3668 | 0.367 |
| -12 | 2B1 | -11.6178 | -0.382 | 28C | -11.8575 | -0.142 | 24E | -12.2915 | 0.291 |
| -13 | 23B | -12.4336 | -0.566 | 1F7 | -12.9843 | -0.016 | 1D6 | -13.279 | 0.279 |
| -14 | 1C9 | -13.4008 | -0.599 | 1BC | -13.5262 | -0.474 | 183 | -14.1229 | 0.123 |
| -15 | 175 | -14.2829 | -0.717 | 160 | -14.5346 | -0.465 | 137 | -15.0724 | 0.072 |
| -16 | 129 | -15.2724 | -0.728 | 11C | -15.4668 | -0.533 | 104 | -15.8503 | -0.150 |
| -17 | EA | -16.3078 | -0.692 | EA | -16.3078 | -0.692 | CE | -16.8613 | -0.139 |
| -18 | C5 | -17.0553 | -0.945 | B7 | -17.3755 | -0.625 | B2 | -17.4958 | -0.504 |
| -19 | A3 | -17.8781 | -1.122 | 99 | -18.1531 | -0.847 | 8D | -18.5078 | -0.492 |
| -20 | 80 | -18.9279 | -1.072 | 7C | -19.0658 | -0.934 | 78 | -19.2082 | -0.792 |
| -21 | 69 | -19.7881 | -1.212 | 5F | -20.2228 | -0.777 | 61 | -20.1323 | -0.868 |
| -22 | 52 | -20.8619 | -1.138 | 4B | -21.2494 | -0.751 | 52 | -20.8619 | -1.138 |
| -23 | 40 | -21.9382 | -1.062 | 3F | -22.0066 | -0.993 | 41 | -21.8709 | -1.129 |
| -24 | 32 | -23.0103 | -0.990 | 35 | -22.7572 | -1.243 | 37 | -22.5964 | -1.404 |
| -25 | 28 | -23.9794 | -1.021 | 27 | -24.0894 | -0.911 | 2E | -23.3724 | -1.628 |
| -26 | 1E | -25.2288 | -0.771 | 20 | -24.9485 | -1.051 | 27 | -24.0894 | -1.911 |
| -27 | 17 | -26.3827 | -0.617 | 17 | -26.3827 | -0.617 | 1D | -25.376 | -1.624 |
| -28 | 13 | -27.2125 | -0.788 | 10 | -27.9588 | -0.041 | 16 | -26.5758 | -1.424 |
| -29 | 10 | -27.9588 | -1.041 | E | -28.5387 | -0.461 | 14 | -26.9897 | -2.010 |
| -30 | 9 | -30.4576 | 0.458 | 9 | -30.4576 | 0.458 | 10 | -27.9588 | -2.041 |

MONITORING CIRCUIT, METHOD FOR OUTPUTTING MONITOR SIGNAL, AND OPTICAL RECEIVER

This Nonprovisional application claims priority under 35 U.S.C. §119(a) on Patent Application No. 2009-124665 filed in Japan on May 22, 2009, the entire contents of which are hereby incorporated by reference.

TECHNICAL FIELD

The present invention relates to a monitoring circuit for outputting a monitor signal indicating a magnitude of a photocurrent which flows across a photodetector, such as a photodiode. Further, the present invention relates to an optical receiver including such a monitoring circuit.

BACKGROUND ART

A PON (Passive Optical Network) is an optical network constituted by a single OLT (Optical Line Terminal) and a plurality of ONUs (Optical Network Unit). In the PON, the OLT and each of the ONUs are connected to each other via a trunk cable and a distribution cable. One end of the trunk cable is connected to the OLT, and the other end of the trunk cable is connected to an optical splitter (optical coupler). One end of the distribution cable is connected to the optical splitter, and the other end of the distribution cable is connected to one of the ONUs.

In the PON, the optical splitter creates a burst optical signal by combining packets received from respective ONUs, and the OLT receives such a burst optical signal. The burst optical signal has a high strength during a period of time in which an optical signal corresponding to a packet transmitted through a path causing a small loss is inputted, and a low strength during a period of time in which an optical signal corresponding to a packet transmitted through a path causing a large loss is inputted. The OLT monitors power of such a burst optical signal for each period of time in which an optical signal is received. Therefore, a failure occurring in a path between the OLT and each of the ONUs can be detected. For this reason, an optical receiver (also called "optical transceiver" in some cases) of the OLT is required to have a power monitor function, that is, a function of outputting a monitor signal indicating power of a received optical signal.

Figure 6:
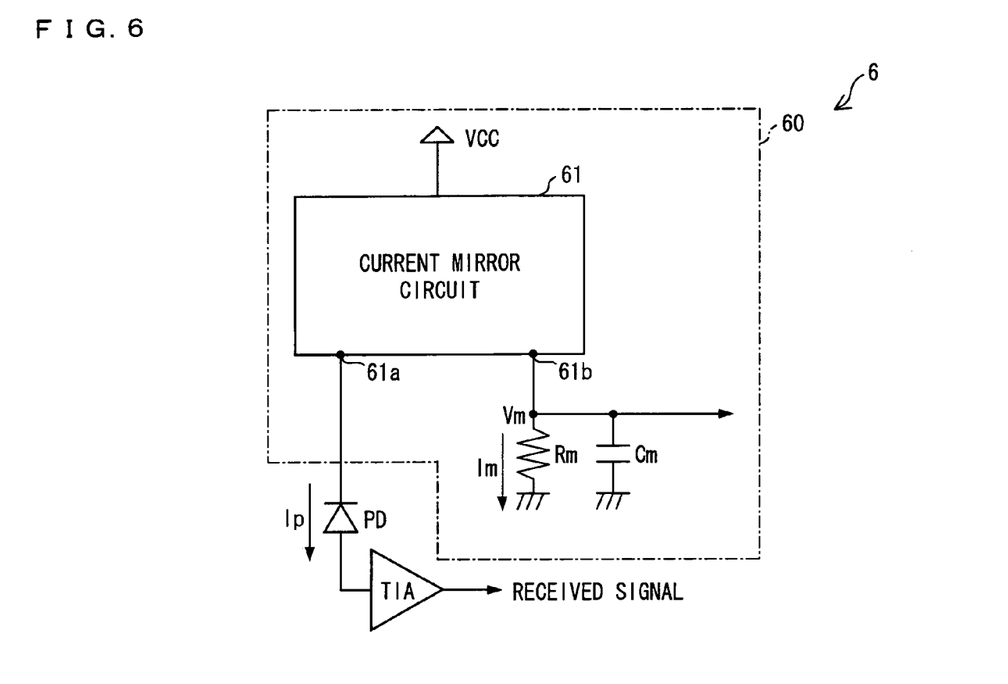
FIG. 6 is a circuit diagram illustrating an optical receiver including a conventional monitoring circuit, showing a conventional art.

FIG. 6 is a circuit diagram illustrating an arrangement of a conventional optical receiver 6 including a monitoring circuit 60 having such a power monitor function. The optical receiver 6 includes a photodiode PD for converting a received optical signal into a current signal, a transimpedance amplifier TIA for converting the current signal obtained by the photodiode PD into a voltage signal, and a monitoring circuit 60 for generating a monitor signal indicating a strength of the current signal obtained by the photodiode PD, i.e. power of the received optical signal (see FIG. 6).

The monitoring circuit 60 includes: a current mirror circuit 61 having an input point 61a connected to the photodiode PD; and a resistor Rm, one end of which is connected to an output point 61b of the current mirror circuit 61, and the other end of which is connected to ground. The monitoring circuit 60 outputs, to an external device, a monitor signal whose value is an electric potential Vm at the output point 61b of the current mirror circuit 61.

In a case where the current mirror circuit 61 has a current mirror ratio of n:1, a monitor current "Im=Ip/n" proportional to a photocurrent Ip flowing across the photodiode PD is outputted from the output point 61b of the current mirror circuit 61. In this case, the electric potential Vm at the output point 61b of the current mirror circuit 61 with respect to ground is "Rm×Im=(Rm/n)×Ip" due to a voltage drop in the resistor Rm, and is proportional to the photocurrent Ip flowing across the photodiode PD. Therefore, a magnitude of the photocurrent Ip flowing across the photodiode PD, i.e. power of the received optical signal, can be found by converting (calibrating) a value Vm of the monitor signal received from the monitoring circuit 60 into "α×Vm" with the use of a conversion coefficient "α", for example.

Figure 7:
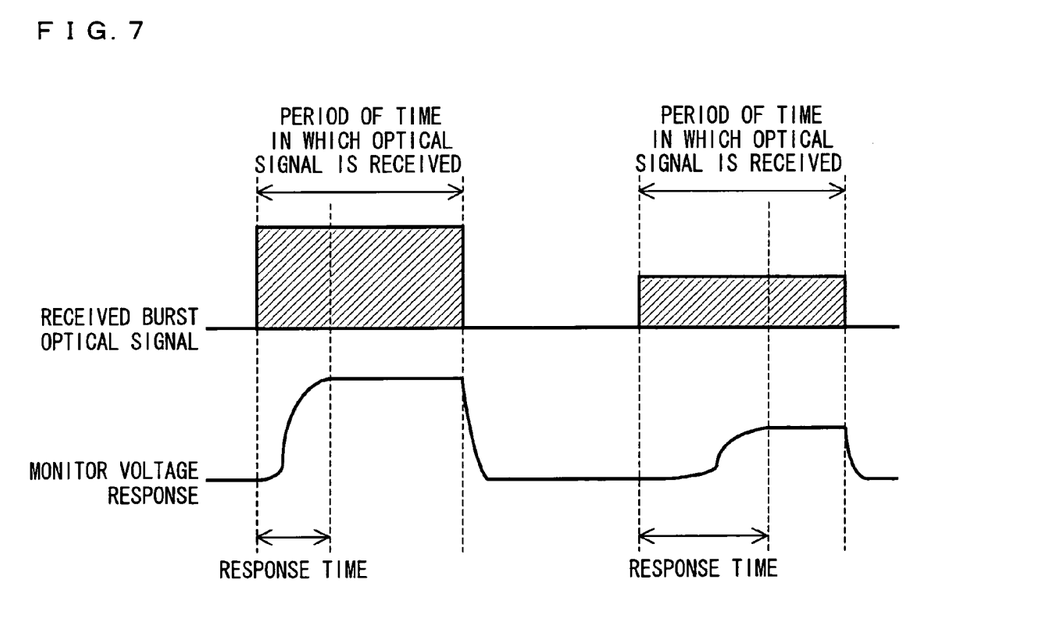
FIG. 7 is a view showing a transition property of a monitor signal generated by the monitoring circuit illustrated in FIG. 6, showing a conventional art.

However, it is difficult to find power of a burst optical signal for each period of time in which an optical signal is received, on the basis of the monitor signal received from the monitoring circuit 60 illustrated in FIG. 6. This is because, in some cases, the value Vm of the monitor signal cannot reach a steady-state value within a period of time in which an optical signal is received, due to the fact that a rise of the electric potential Vm at the output point 61b of the current mirror circuit 61 is delayed for several μ seconds to several tens of μ seconds with respect to a start point of the period of time in which an optical signal is received (see FIG. 7). This delay is mainly due to a time necessary to turn transistors constituting the current mirror circuit 61 from a nonconductive state into a conductive state.

Figure 8:
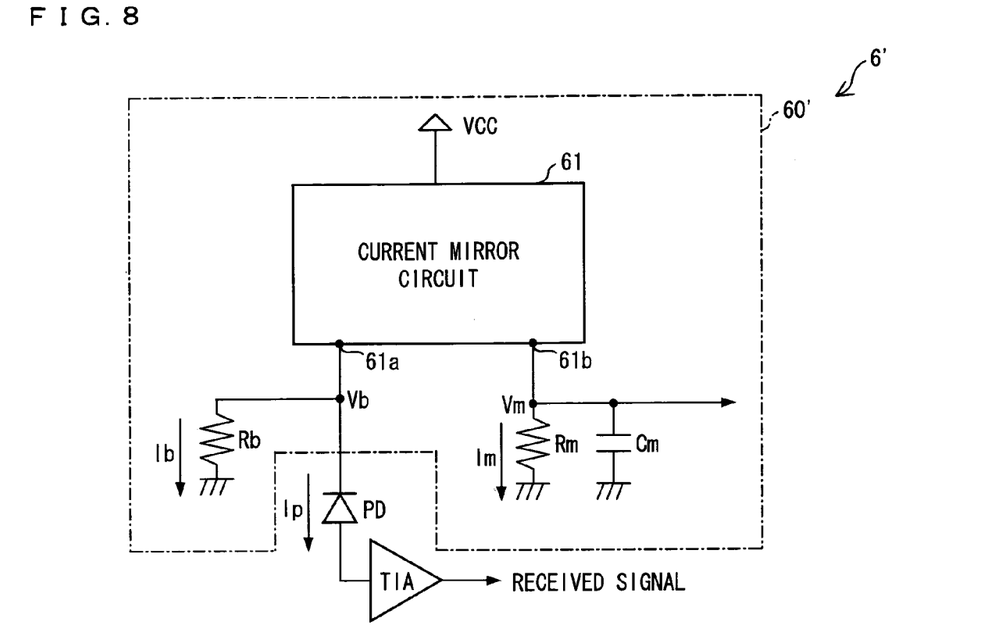
FIG. 8 is a circuit diagram illustrating an optical receiver including a conventional monitoring circuit, showing a conventional art.

Therefore, a monitoring circuit 60' illustrated in FIG. 8 is employed in place of the monitoring circuit 60 illustrated in FIG. 6 by the optical receiver for receiving a burst optical signal, such as an optical receiver of the OLT. The monitoring circuit 60' illustrated in FIG. 8 is such that the monitoring circuit 60 illustrated in FIG. 6 further includes a load resistor Rb, one end of which is connected to the input point 61a of the current mirror circuit 61, and the other end of which is connected to ground. The monitoring circuit 60' outputs a monitor signal whose value is an electric potential Vm at the output point 61b of the current mirror circuit 61 in the same manner as the monitoring circuit 60 illustrated in FIG. 6.

Figure 9:
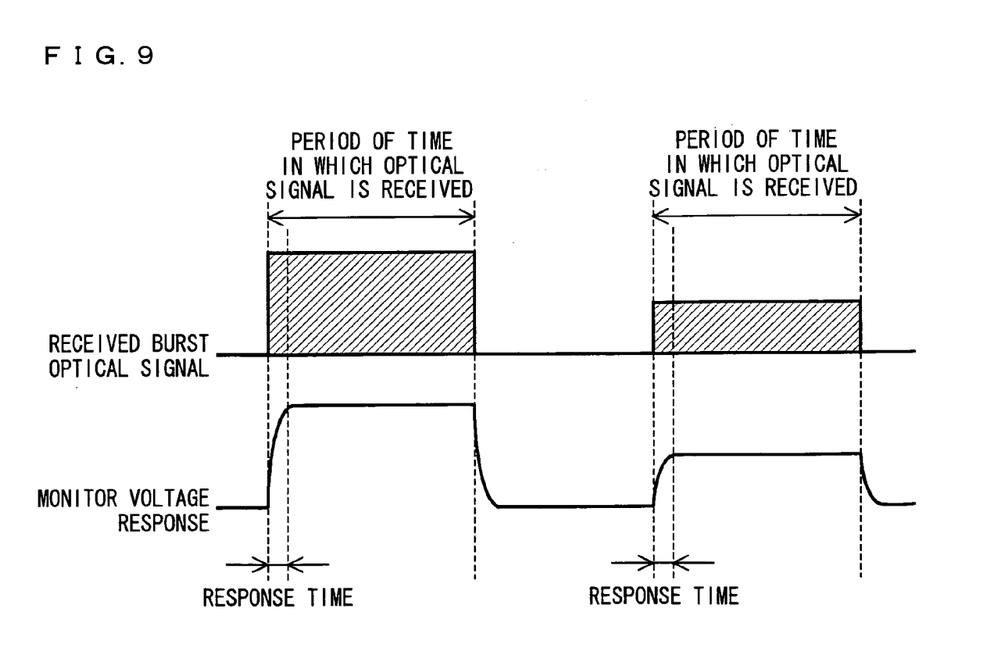
FIG. 9 is a view showing a transition property of a monitor signal generated by the monitoring circuit illustrated in FIG. 8, showing a conventional art.

In this arrangement, the input point 61a of the current mirror circuit 61 is connected to ground via the load resistor Rb, so that a weak standby current Ib can be kept flowing across the transistors constituting the current mirror circuit 61 even outside a period of time in which an optical signal is received. Because of this, the transistors constituting the current mirror circuit 61 are retained in the conductive state even outside a period of time in which an optical signal is received. This allows the electric potential Vm at the output point 61b of the current mirror circuit 61 to quickly rise at a start point of each period of time in which an optical signal is received (see FIG. 9).

In the arrangement, the input point 61a of the current mirror circuit 61 receives not only the photocurrent Ip flowing across the photodiode PD but also the standby current Ib flowing across the load resistor Rb. It follows that the output point 61b of the current mirror circuit 61 outputs the monitor current Im containing an offset component "Ib/n" corresponding to the standby current Ib. As a result, the electric potential Vm at the output point 61b of the current mirror circuit 61 contains an offset component "(Rm/n)×Ib" corresponding to the standby current Ib. Therefore, in a case where the input point 61a of the current mirror circuit 61 is connected to ground via the load resistor Rb, calculation of a magnitude of the photocurrent Ip flowing across the photodiode PD requires conversion (calibration) of the value Vm of the monitor signal, received from the monitoring circuit 60', into "α×Vm+β" with the use of conversion coefficients α and β.

Patent Literature 1 discloses an OLT for finding power of a received optical signal by converting a voltage value Vout, which corresponds to the value Vm of the monitor signal described above, into "A×Vout+B+f (Vout)" (see FIG. 1 and Paragraph [0039] of Patent Literature 1). Here, A and B are constants, and f (Vout) is a function indicating a magnitude of an offset current outside the period of time in which an optical signal is received.

Note that the standby current Ib flows across the load resistor Rb constantly regardless of whether or not an optical signal is being inputted, so that the value Vm (t) of the monitor signal contains an offset component regardless of whether or not an optical signal is being received. For this reason, hereinafter, the standby current Ib is also referred to as "offset current".

CITATION LIST

Patent Literature 1
Japanese Patent Application Publication, Tokukai, No. 2007-37118 A (Publication Date: Feb. 8, 2007).

SUMMARY OF INVENTION

Technical Problem

However, it has been difficult to accurately calculate power of an optical signal over a wide temperature range on the basis of the value Vm of the monitor signal received from the monitoring circuit 60' illustrated in FIG. 8. The following description specifically deals with this problem with reference to FIG. 8.

That is, a resistance value of the load resistor Rb fluctuates due to a fluctuation in ambient temperature or the like. This causes a fluctuation in magnitude of the offset current Ib. For this reason, a magnitude of the offset component "(Rm/n)× Ib" in the value Vm of the monitor signal also fluctuates in accordance with a fluctuation in ambient temperature. Because of this, power of an optical signal cannot be calculated accurately in a case where the value Vm of the monitor signal is obtained at a certain ambient temperature, and is converted (calibrated) into "α×Vm+β" with the use of a pair of conversion coefficients α and β determined at a different ambient temperature. A similar problem occurs even with the use of the conversion formula disclosed in Patent Literature 1. Particularly, a monitoring circuit used in an environment having a large fluctuation in ambient temperature, e.g. outdoors, is affected by such a problem more greatly.

The present invention is made in view of the problem. An object of the present invention is to realize a monitoring circuit which is capable of providing a monitor signal with which a magnitude of a current flowing across a photodetector, such as a photodiode, can be accurately calculated over a wide temperature range on the basis of a value of the monitor signal.

Solution to Problem

In order to attain the object, a monitoring circuit of the present invention includes: a current mirror circuit for outputting a monitor current proportional to an input current, the current mirror circuit having an input point for receiving the input current, the input point being connected to a photodetector and a load resistor, which are connected thereto in parallel; and an output circuit for outputting a monitor signal indicating a difference between a monitor electric potential proportional to the monitor current, and an offset electric potential proportional to an offset current which flows across the load resistor concurrently with the monitor current.

Further, in order to attain the object, a method of the present invention, for outputting a monitor signal, includes: generating a monitor current proportional to an input current by use of a current mirror circuit having an input point for receiving the input current, the input point being connected to a photodetector and a load resistor, which are connected thereto in parallel; and outputting a monitor signal indicating a difference between a monitor electric potential proportional to the monitor current, and an offset electric potential proportional to an offset current which flows across the load resistor concurrently with the monitor current.

According to the arrangement, the current mirror circuit receives the offset current (standby current) via the load resistor even outside a period of time in which an optical signal is received. This allows a quick rise of the monitor electric potential at a start point of the period of time in which an optical signal is received. Therefore, power of a burst optical signal received by use of the photodetector can be calculated on the basis of the monitor signal.

Moreover, according to the arrangement, the monitor signal indicating the difference between the monitor electric potential and the offset electric potential is outputted. That is, it is possible to obtain a monitor signal which (i) has a value proportional to a photocurrent flowing across the photodetector, and (ii) does not depend on a magnitude of the offset current flowing across the load resistor.

A resistance value of the load resistor fluctuates due to a fluctuation in ambient temperature or the like. This causes a fluctuation in magnitude of the offset current flowing across the load resistor. According to the arrangement, however, the fluctuation in magnitude of the offset current has no influence on the value of the monitor signal. Therefore, it is possible to provide a monitor signal with which power of an optical signal received by use of a photodetector, such as a photodiode, can be calculated accurately over a wide temperature range.

In order to attain the object, a monitoring circuit of the present invention includes: a current mirror circuit for outputting a monitor current proportional to an input current, the current mirror circuit having an input point for receiving the input current, the input point being connected to a photodetector and a load resistor, which are connected thereto in parallel; a first output circuit for outputting a monitor signal indicating a monitor electric potential proportional to the monitor current; and a second output circuit for outputting an offset signal indicating an offset electric potential proportional to an offset current which flows across the load resistor concurrently with the monitor current.

Further, in order to attain the object, a method of the present invention, for outputting a monitor signal, includes: generating a monitor signal proportional to an input current by use of a current mirror circuit having an input point for receiving the input current, the input point being connected to a photodetector and a load resistor, which are connected thereto in parallel; outputting a monitor signal indicating a monitor electric potential proportional to the monitor current; and outputting an offset signal indicating an offset electric potential proportional to an offset current which flows across the load resistor concurrently with the monitor current.

According to the arrangement, the current mirror circuit receives the offset current (standby current) via the load resistor even outside a period of time in which an optical signal is received. This allows a quick rise of the monitor electric potential at a start point of the period of time in which an optical signal is received. Therefore, power of a burst optical signal received by use of the photodetector can be calculated on the basis of the monitor signal.

Moreover, according to the arrangement, the monitor signal indicating the monitor electric potential and the offset signal indicating the offset electric potential are outputted. Therefore, it is possible to obtain a difference between a value of the monitor signal and a value of the offset signal, which difference (i) is proportional to a photocurrent flowing across the photodetector, and (ii) does not depend on a magnitude of the offset current flowing across the load resistor.

A resistance value of the load resistor fluctuates due to a fluctuation in ambient temperature or the like. This causes a fluctuation in magnitude of the offset current flowing across the load resistor. According to the arrangement, however, the fluctuation in magnitude of the offset current has no influence on the difference between the value of the monitor signal and the value of the offset signal. Therefore, power of an optical signal received by use of a photodetector, such as a photodiode, can be calculated accurately over a wide temperature range on the basis of the difference between the value of the monitor signal and the value of the offset signal.

Advantageous Effects of Invention

As described above, a monitoring circuit of the present invention outputs a monitor signal indicating a difference between a monitor electric potential proportional to a monitor current, and an offset electric potential proportional to an offset current which flows across a load resistor concurrently with the monitor current. Further, a monitoring circuit of the present invention outputs a monitor signal indicating a monitor electric potential proportional to a monitor current, and an offset signal indicating an offset electric potential proportional to an offset current which flows across a load resistor concurrently with the monitor current.

Furthermore, a method of the present invention, for outputting a monitor signal, includes the step of outputting a monitor signal indicating a difference between a monitor electric potential proportional to the monitor current, and an offset electric potential proportional to an offset current which flows across a load resistor concurrently with the monitor current. Furthermore, a method of the present invention, for outputting a monitor signal, includes the step of outputting a monitor signal indicating a monitor electric potential proportional to a monitor current, and an offset signal indicating an offset electric potential proportional to an offset current which flows across a load resistor concurrently with the monitor current.

Therefore, it is possible to provide a monitor signal with which power of an optical signal received by use of a photodiode can be calculated accurately over a wide temperature range.

DESCRIPTION OF EMBODIMENTS

Embodiments of the present invention are described below with reference to drawings. A monitoring circuit in accordance with each of the embodiments described below is constituted as a monitoring circuit for generating a monitor signal indicating a magnitude of a photocurrent flowing across a non-avalanche photodiode. Note however that the present invention is not limited to this monitoring circuit. That is, the present invention can be applied to a monitoring circuit for monitoring a photocurrent flowing across another photodetector, such as a monitoring circuit for generating a monitor signal indicating a magnitude of a photocurrent flowing across an avalanche photodiode.

First Embodiment

The following description deals with the first embodiment of the present invention with reference to FIGS. 1 through 4.

(Arrangement of Monitoring Circuit)

Figure 1:
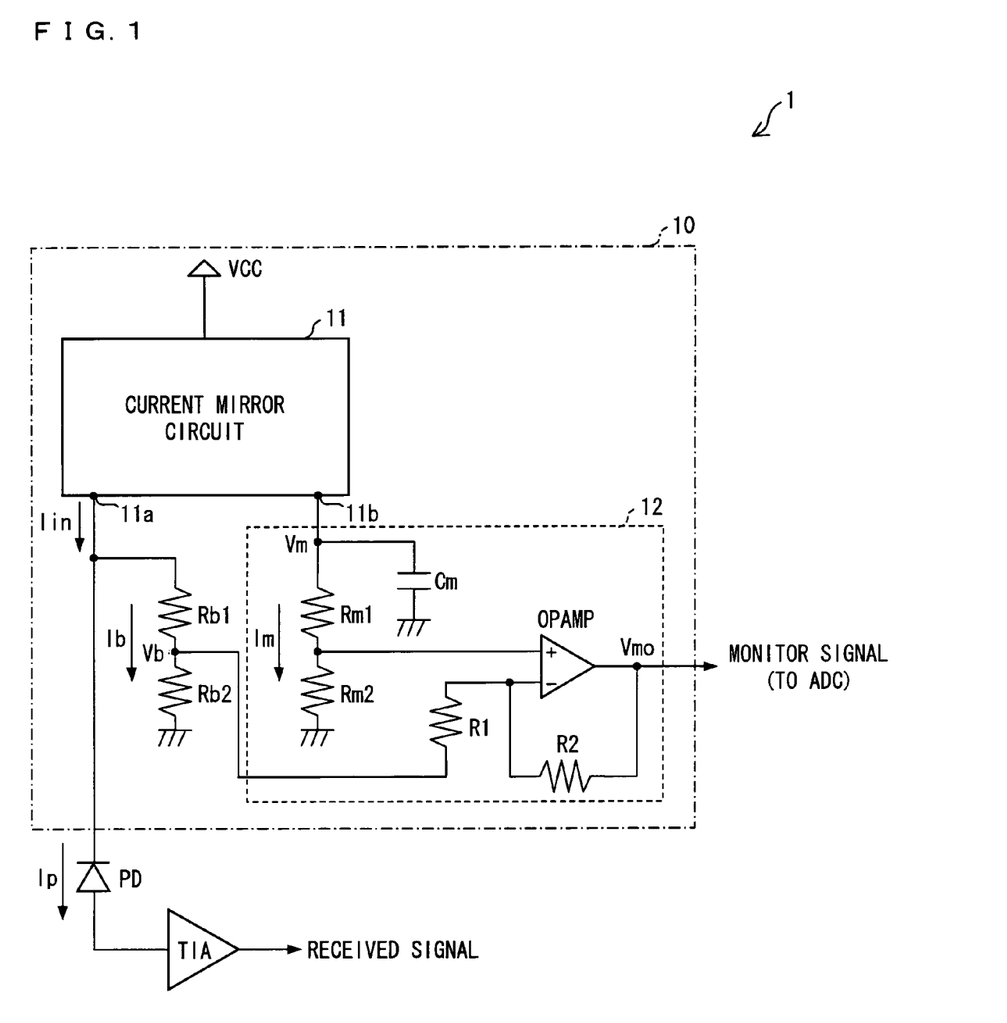
FIG. 1 is a circuit diagram illustrating an optical receiver including a monitoring circuit of the present invention, showing the first embodiment of the present invention.

First, an arrangement of a monitoring circuit 10 in accordance with the present embodiment is described below with reference to FIG. 1. FIG. 1 is a circuit diagram illustrating an arrangement of an optical receiver 1. The optical receiver 1 includes a photodiode PD, a transimpedance amplifier TIA connected to the anode side of the photodiode PD, and the monitoring circuit 10 connected to the cathode side of the photodiode PD (see FIG. 1).

The photodiode PD is means for converting a received optical signal into a current signal. The transimpedance amplifier TIA is means for converting the current signal obtained by the photodiode PD into a voltage signal. Various signal processing circuit (not illustrated) for processing the voltage signal obtained by the transimpedance amplifier TIA may be provided in the downstream of the transimpedance amplifier TIA.

The monitoring circuit 10 is a circuit for generating a monitor signal indicating a strength of the current signal obtained by the photodiode PD (a magnitude of a photocurrent Ip flowing though the photodiode PD), i.e. power of a received optical signal. The monitoring circuit 10 in accordance with the present embodiment includes (1) a current mirror circuit 11 having an input point 11a connected to the photodiode PD, (2) a load resistor Rb, one end of which is connected to the input point 11a of the current mirror circuit 11, and the other end of which is connected to ground, which load resistor Rb is constituted by a load resistors Rb1 and Rb2 series-connected to each other, and (3) an output circuit 12 connected to: an output point 11b of the current mirror circuit 11; and an intermediate point between the load resistors Rb1 and Rb2 (see FIG. 1). The load resistor Rb causes a standby current of approximately several tens of μA to flow across transistors constituting the current mirror circuit 11 even outside a period of time in which an optical signal is received. A resistance value of the load resistor Rb is set to several MΩ.

The current mirror circuit 11 has a function of outputting, from the output point 11b, a monitor current Im proportional to an input current Iin received by the input point 11a (an example of an arrangement of the current mirror circuit 11 will be described later with reference to another drawing). That is, in a case where the current mirror circuit 11 has a current mirror ratio of n:1, a relationship shown by the following Formula (1) can be established between the input current Iin and the monitor current Im.

$$Im=Iin/n \tag{1}$$

As described above, the input point 11a of the current mirror circuit 11 is connected to: the photodiode PD; and the load resistor Rb. Therefore, the input current Iin received by the input point 11a of the current mirror circuit 11 is a sum of a photocurrent Ip flowing across the photodiode PD and an offset current Ib flowing across the load resistor Rb, as shown by Formula (2). Accordingly, the monitor current Im outputted from the output point 11b of the current mirror circuit 11 is proportional to a sum of the photocurrent Ip flowing across the photodiode PD, and the offset current Ib flowing across the load resistors Rb1 and Rb2, as shown by Formula (3).

$$Iin=Ip+Ib \tag{2}$$

$$Im=(Ip+Ib)/n \tag{3}$$

The output circuit 12 has a function of generating a monitor signal indicating a magnitude of the photocurrent Ip flowing across the photodiode PD, on the basis of: a monitor electric potential Vm proportional to the monitor current Im; and an offset electric potential Vb proportional to the offset current Ib which flows across the load resistor Rb concurrently with the monitor current Im. Particularly, the output circuit 12 of the monitoring circuit 10 in accordance with the present embodiment has a function of generating a monitor signal indicating a difference "Vm−Vb" between the monitor electric potential Vm and the offset electric potential Vb, where the monitor electric potential Vm is an electric potential at the output point 11b of the current mirror circuit 11 with respect to ground, and the offset electric potential Vb is an electric potential at the intermediate point between the load resistors Rb1 and Rb2 with respect to ground.

The output circuit 12 having such a function may be a differential amplifier circuit which receives the monitor electric potential Vm as a noninverting input, and the offset electric potential Vb as an inverting input (see FIG. 1). That is, the output circuit 12 can be constituted by (1) an operational amplifier OPAMP, (2) an input resistor Rm1, one end of which is connected to the output point 11b of the current mirror circuit 11, and the other end of which is connected to a noninverting input terminal+ of the operational amplifier OPAMP, (3) a ground resistor Rm2, one end of which is connected to an intermediate point between the input resistance Rm1 and the noninverting input terminal+ of the operational amplifier OPAMP, and the other end of which is connected to ground, (4) an input resistance R1, one end of which is connected to an intermediate point between the load resistors Rb1 and Rb2, and the other end of which is connected to an inverting input terminal− of the operational amplifier OPAMP, and (5) a feedback resistor R2, one end of which is connected to an output terminal of the operational amplifier OPAMP, and the other end of which is connected to the inversing input terminal− of the operational amplifier OPAMP. The output circuit 12 may further include a capacitor Cm, one end of which is connected to the output point 11b of the current mirror circuit 11, and the other end of which is connected to ground. A capacitance of the capacitor Cm is set so as to stabilize the monitor electric potential Vm within a requested period of time.

Here, a resistance value of the input resistor R1 and a resistance value of the input resistor Rm1 are set to be equal to each other, and a resistance value of the feedback resistor R2 and a resistance value of the ground resistor Rm2 are set to be equal to each other. With this setting, it is possible to cause a value Vmo of a monitor signal outputted from the output terminal of the operational amplifier OPAMP to be proportional to the difference "Vm−Vb" between the monitor electric potential Vm and the offset electric potential Vb. In this case, the output circuit 12 serving as a differential amplifier circuit has a gain equal to a ratio of R1:R2 (i.e. a resistance value of the input resistor R1:a resistance value of the feedback resistor R2). That is, in a case where equalities of "R1=Rm1" and "R2=Rm2" are satisfied, an equality of "Vmo=(R2/R1)×(Vm−Vb)" can be established. For example, it is possible to cause the value Vmo of the output signal of the operational amplifier OPAMP to be equal to the difference "Vm−Vb" between the monitor electric potential Vm and the offset electric potential Vb, by setting a resistance value of the input resistor R1 and a resistance value of the feedback resistor R2 to be equal to each other. Further, setting of the gain in accordance with a dynamic range of an AD converter makes it possible to convert the monitor electric potential into a digital signal highly accurately.

In the output circuit 12, the monitor electric potential Vm, i.e. an electric potential Vm at the output point 11b of the current mirror circuit 11, is proportional to the monitor current Im, as shown by Formula (4). Further, the offset electric potential Vb, i.e. an electric potential Vb at the intermediate point between the load resistors Rb1 and Rb2, is proportional to the offset current Ib, as shown by Formula (5).

$$Vm=(Rm1+Rm2)\times Im \tag{4}$$

$$Vb=Rb2\times Ib \tag{5}$$

Therefore, in a case where Formula (6) is satisfied by setting each of resistance values of the load resistor Rb2, the input resistor Rm1 and the ground resistor Rm2, the difference "Vm−Vb" between the monitor electric potential Vm and the offset electric potential Vb is proportional to the photocurrent Ip, as shown in Formula (7).

$$(Rm1+Rm2):Rb2=n:1 \tag{6}$$

$$Vm-Vb=\{(Rm1+Rm2)/n\}\times Ip \tag{7}$$

Accordingly, a value of the monitor signal generated by the output circuit 12 is proportional to the photocurrent Ip flowing across the photodiode PD, and does not depend on the offset current Ib flowing across the load resistor Rb.

Therefore, even if the resistance value of the load resistor Rb fluctuates due to a fluctuation in ambient temperature, the fluctuation in resistance value of the load resistor Rb has no influence on the value of the monitor signal generated by the output circuit 12. In other words, the output circuit 12 functions as a temperature fluctuation compensating circuit with respect to the load resistor Rb. That is, it is possible to accurately calculate a magnitude of the photocurrent Ip flowing across the photodiode PD over a wide temperature range, on the basis of the monitor signal generated by the output circuit 12.

The monitoring circuit 10 illustrated in FIG. 1 outputs a monitor signal in a form of an analog signal to an external device. Note however that the present invention is not limited to this. That is, a monitoring circuit which (i) includes an AD converter for converting a monitor signal into a digital signal, and (ii) outputs the digital signal obtained by the AD converter to an external device, is encompassed within the scope of the present invention.

(Example of Arrangement of Current Mirror Circuit)

Figure 2:
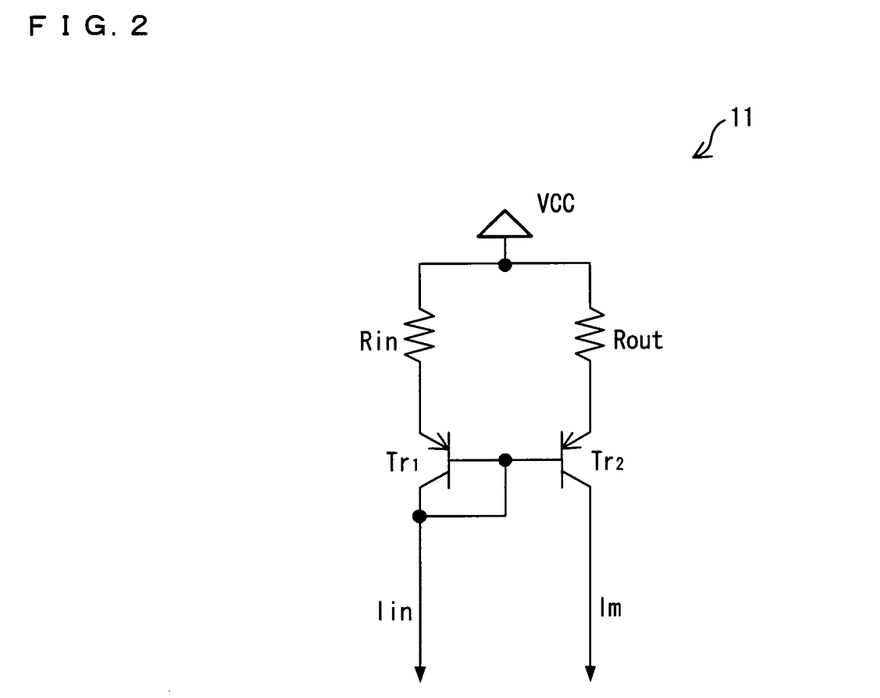
FIG. 2 is a circuit diagram illustrating an arrangement of a current mirror circuit included in the monitoring circuit of the present invention, showing the first embodiment of the present invention.

Next, the following description deals with an example of an arrangement of the current mirror circuit 11 included in the monitoring circuit 10, with reference to FIG. 2. FIG. 2 is a circuit diagram illustrating an example of the arrangement of the current mirror circuit 11 included in the monitoring circuit 10.

The current mirror circuit 11 illustrated in FIG. 2 is constituted by a pair of PNP transistors (transistors $Tr_1$ and $Tr_2$), base terminals of which are connected to each other. A collector terminal of the transistor $Tr_1$ of FIG. 2 corresponds to the input point 11a of the current mirror circuit 11 of FIG. 1, and a collector terminal of the transistor $Tr_2$ of FIG. 2 corresponds to the output point 11b of the current mirror circuit 11 of FIG. 1.

In the current mirror circuit 11 illustrated in FIG. 2, emitter terminals of the transistors $Tr_1$ and $Tr_2$ are connected to a voltage source Vcc via resistors Rin and Rout, respectively, and the transistor $Tr_1$ has a short circuit between the base terminal and the collector terminal. Therefore, a collector current flowing across the transistor $Tr_2$ is proportional to a collector current flowing across the transistor $Tr_1$. That is, the monitor current Im flowing out from the output point 11b is proportional to the input current Iin flowing out from the input point 11a, as described above.

Note that the arrangement of the current mirror circuit 11 included in the monitoring circuit 10 is not limited to the one illustrated in FIG. 2. The current mirror circuit 11 constituted by a pair of the PNP transistors can be replaced with a current mirror circuit constituted by a pair of NPN transistors, for example. Further, the current mirror circuit 11 constituted by a pair of such bipolar transistors can be replaced with a current mirror circuit constituted by a pair of field effect transistors. Furthermore, a circuit configuration of the current mirror circuit 11 is not particularly limited, and any circuit configurations may be applicable as long as the circuit configuration allows the circuit to have a function of outputting a monitor current proportional to an input current.

(Temperature Fluctuation Compensation Effect)

Figure 3:
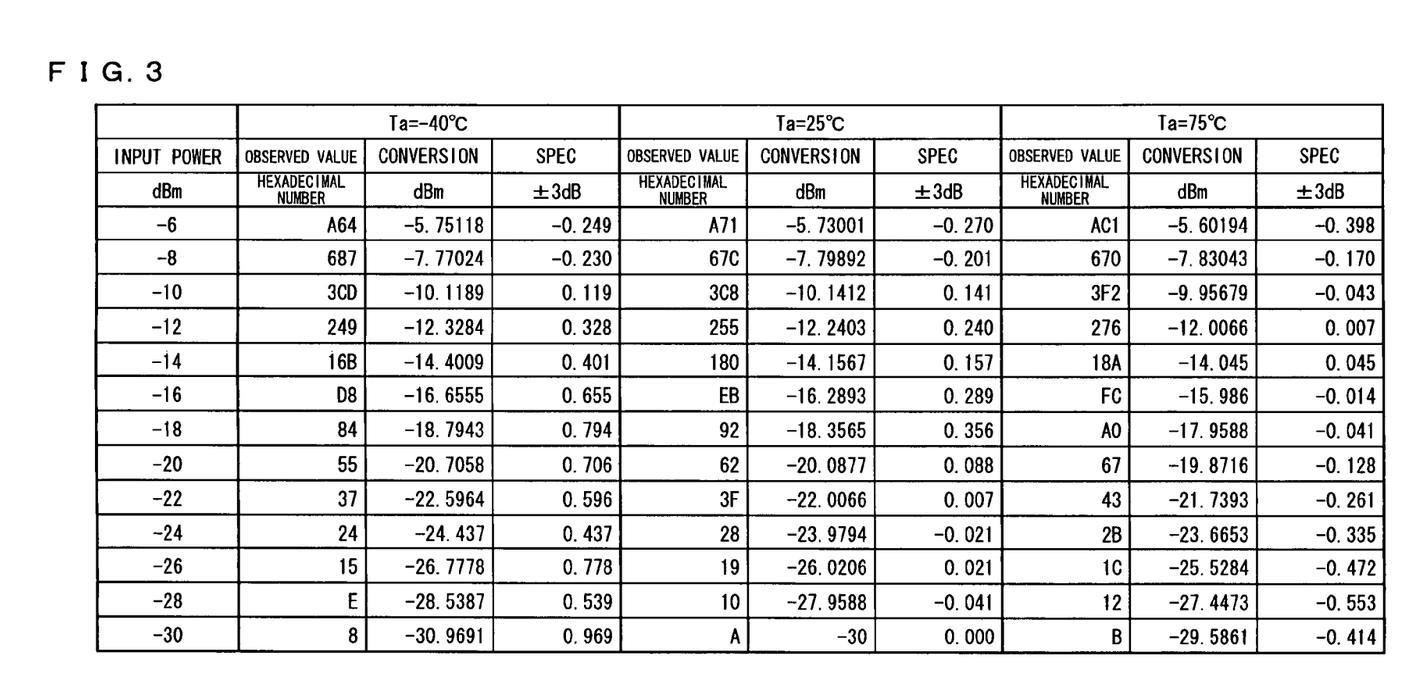
FIG. 3 is a table showing results of measurement of power of optical signals received by the monitoring circuit of the present invention.
Figure 4:
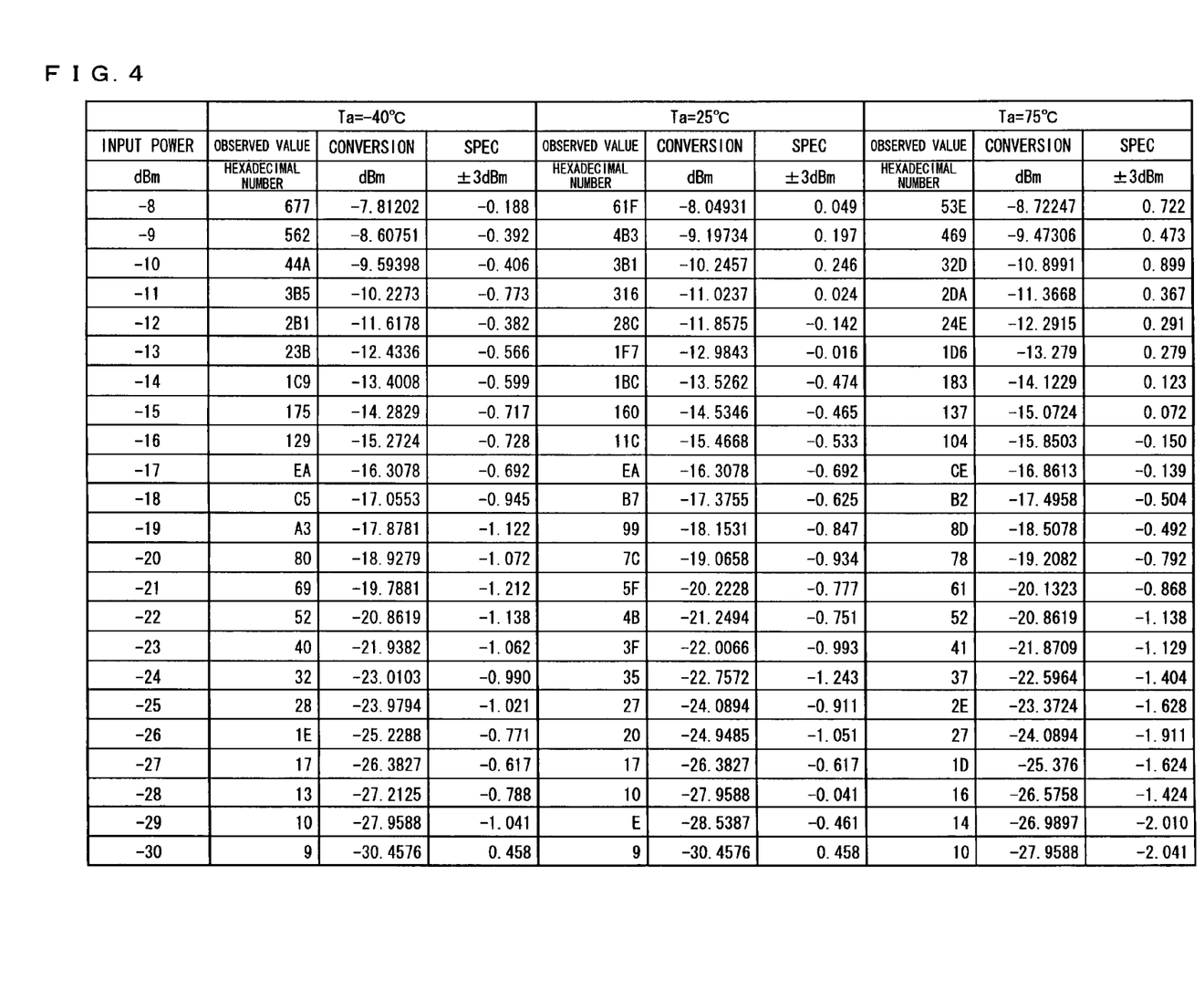
FIG. 4 is a table showing results of measurement of power of optical signals received by a conventional monitoring circuit.

Next, the following description deals with a temperature fluctuation compensation effect of the monitoring circuit 10 in accordance with the present embodiment with reference to FIGS. 3 and 4.

FIG. 3 is a table showing values which are (i) a value x (OBSERVED VALUE in FIG. 3) of the monitor signal outputted from the monitoring circuit 10 (see FIG. 1) of the present invention, which value x was obtained in a case where an optical signal having known power P was received, (ii) a value P' (CONVERSION in FIG. 3) of received power (power of the received optical signal), which value P' was found by conversion of the value x of the monitor signal into "P'=$\alpha x^2$+$\beta x$+$\gamma$" with the use of conversion coefficients $\alpha$, $\beta$, and $\gamma$, and (iii) an error (SPEC in FIG. 3) between the value P' of the received power thus found and a value P of real received power.

Each of results of measurement, shown in FIG. 3, was obtained by inputting, into the monitoring circuit 10, an optical signal having input power in a range of −30 dBm to −6 dBm (by 2 dBm steps) at each of temperatures of −40° C., 25° C., and 75° C. The conversion coefficients $\alpha$, $\beta$, and $\gamma$ were set by use of values $(x_1, x_2, \ldots x_n)$ observed at the temperature of 25° C. so that a square sum of the error "$\Sigma_i|(\alpha x_i^2+(\beta x_i+\gamma)-P_i|^2$" was minimized. The monitoring circuit 10 had the following constants in the measurement.

Current mirror ratio=10:1
Rb1=2MΩ, Rb2=3 kΩ
Rm1=Rm2=15 kΩ
R1=R2=15 kΩ
Cm=10 pF

Here, the value x of the monitor signal is converted into "$\alpha x^2+\beta x+\gamma$" with the use of the conversion coefficients $\alpha$, $\beta$, and $\gamma$. Note however that the value x of the monitor signal can be converted into $\alpha x$ with the use of the conversion coefficient $\alpha$ only. This is because the value of the monitor signal is proportional to a magnitude of the photocurrent Ip. However, the conversion of the value x of the monitor signal into "$\alpha x^2+\beta x+\gamma$" with the use of the conversion coefficients $\alpha$, $\beta$, and $\gamma$ allows removal of not only an offset component derived from the current Ib flowing across the load resistor Rb but also other offset components.

As is clear from FIG. 3, in a case where the received power is calculated on the basis of the value of the monitor signal outputted from the monitor circuit 10, the error does not exceed a range of 1 dB. Further, it is possible to suppress the error to be within the range of 1 dB by carrying out calibration (setting of the conversion coefficients $\alpha$, $\beta$, and $\gamma$) only at a certain ambient temperature (here, at 25°). This shows that the monitoring circuit 10 has a significantly high temperature fluctuation compensation effect.

On the other hand, FIG. 4 is a table showing values which are (i) a value x (OBSERVED VALUE) of a monitor signal outputted from the conventional monitoring circuit 60' (see FIG. 8), which value x was obtained in a case where an optical signal having known power was received, (ii) a value P' of the received power, which value P' was found by conversion of the value x of the monitor signal into "P'=$\alpha x^2+\beta x+\gamma$" with the use of the conversion coefficients $\alpha$, $\beta$, and $\gamma$, and (iii) an error between the value P' of the received power thus found and a value P of real received power.

Each of results of measurement, shown in FIG. 4, was obtained by inputting, into the monitoring circuit 60', an optical signal having input power in a range of −30 dBm to −6 dBm (by 1 dBm step) at each of ambient temperatures of −40° C., 25° C., and 75° C. Here, the conversion coefficients $\alpha$, $\beta$, and $\gamma$ for converting a value observed at each of the ambient temperatures were set with the use of values $(x_1, x_2, \ldots x_n)$ observed at each of the ambient temperatures so that a square sum of the error "$\Sigma_i|(\alpha x_i^2+\beta x_i+\gamma)-P_i|^2$" was minimized. That is, the calibration was carried out for each of the ambient temperatures. The monitoring circuit 60' had the following constants in the measurement.

Current mirror ratio=10:1
Rb=2 MΩ
Rm=30 kΩ
Cm=10 pF

As is clear from a comparison between FIGS. 3 and 4, accuracy of the received power calculated on the basis of the value of the monitor signal outputted from the monitoring circuit 10 of the present invention is higher than that of the received power calculated on the basis of the value of the monitor signal outputted from the conventional monitoring circuit 60'. Particularly, the accuracy with the use of the monitoring circuit 60 is significantly higher in a high temperature environment than with the use of the conventional monitoring circuit 60'.

Conclusion of First Embodiment

As described above, a monitoring circuit in accordance with the present embodiment includes: a current mirror circuit for outputting a monitor current proportional to an input current, the current mirror circuit having an input point for receiving the input current, the input point being connected to a photodetector; a load resistor, the load resistor and the photodetector being connected to the input point of the current mirror circuit in parallel; and an output circuit for outputting a monitor signal indicating a difference between a monitor electric potential proportional to the monitor current, and an offset electric potential proportional to an offset current which flows across the load resistor concurrently with the monitor current. In other words, the monitoring circuit includes: a current mirror circuit for outputting a monitor current proportional to an input current, the current mirror circuit having an input point for receiving the input current, the input point being connected to a photodetector and a load resistor, which are connected thereto in parallel; and an output circuit for outputting a monitor signal indicating a difference between a monitor electric potential proportional to the monitor current, and an offset electric potential proportional to an offset current which flows across the load resistor together concurrently with the monitor current.

Further, a method in accordance with the present embodiment, for outputting a monitor signal, employing a monitoring circuit including: a current mirror circuit for outputting a monitor current proportional to an input current, the current mirror circuit having an input point for receiving the input current, the input point being connected to a photodetector; and a load resistor, the load resistor and the photodetector being connected to the input point of the current mirror circuit in parallel, includes the step of outputting a monitor signal indicating a difference between a monitor electric potential proportional to the monitor current, and an offset electric potential proportional to an offset current which flows across the load resistor concurrently with the monitor current. In other words, the method includes: generating a monitor current proportional to an input current by use of a current mirror circuit having an input point for receiving the input current, the input point being connected to a photodetector and a load resistor, which are connected thereto in parallel; and outputting a monitor signal indicating a difference between a monitor electric potential proportional to the monitor current and an offset electric potential proportional to an offset current which flows across the load resistor concurrently with the monitor current.

According to the arrangement, the current mirror circuit receives the offset current (standby current) via the load resistor even outside a period of time in which an optical signal is received. This allows a quick rise of the monitor electric potential at a start point of the period of time in which the optical signal is received. Therefore, power of a burst optical signal received by use of the photodetector can be calculated on the basis of the monitor signal.

Moreover, according to the arrangement, the monitor signal indicating the difference between the monitor electric potential and the offset electric potential is outputted. That is, it is possible to obtain a monitor signal which (i) has a value proportional to the photocurrent flowing across the photodetector, and (ii) does not depend on a magnitude of the offset current flowing across the load resistor.

A resistance value of the load resistor fluctuates due to a fluctuation in ambient temperature or the like. This causes a fluctuation in magnitude of the offset current flowing across the load resistor. According to the arrangement, however, the fluctuation in magnitude of the offset current has no influence on the value of the monitor signal. Therefore, it is possible to provide a monitor signal with which power of an optical signal received by use of a photodetector, such as a photodiode, can be calculated accurately over a wide temperature range.

Further, in the monitoring circuit in accordance with the present embodiment, it is preferable that the current mirror circuit has a current mirror ratio equal to a ratio of a resistance value of a resistor for converting the monitor current into the monitor electric potential to a resistance value of a resistor for converting the offset current into the offset electric potential.

According to the arrangement, it is possible to cause the difference between the monitor electric potential and the offset electric potential to be proportional to a magnitude of the photocurrent flowing across the photodetector, regardless of current mirror ratio of the current mirror circuit.

Further, in the monitoring circuit in accordance with the present embodiment, it is preferable that the output circuit is a differential amplifier circuit which receives the monitor electric potential as a noninverting input and the offset electric potential as an inverting input.

According to the arrangement, it is possible to amplify the monitor signal by a gain which is set in accordance with a dynamic range of an AD converter for converting the monitor signal from an analog signal into a digital signal. Therefore, it is also possible to convert, by the AD converter, the monitor signal into a digital signal highly accurately.

An optical receiver in accordance with the present embodiment includes a monitoring circuit in accordance with the present embodiment. Therefore, the optical receiver can provide a monitor signal with which it is possible to accurately calculate, over a wide temperature range, power of an optical signal received by use of the photodiode.

Second Embodiment

Figure 5:
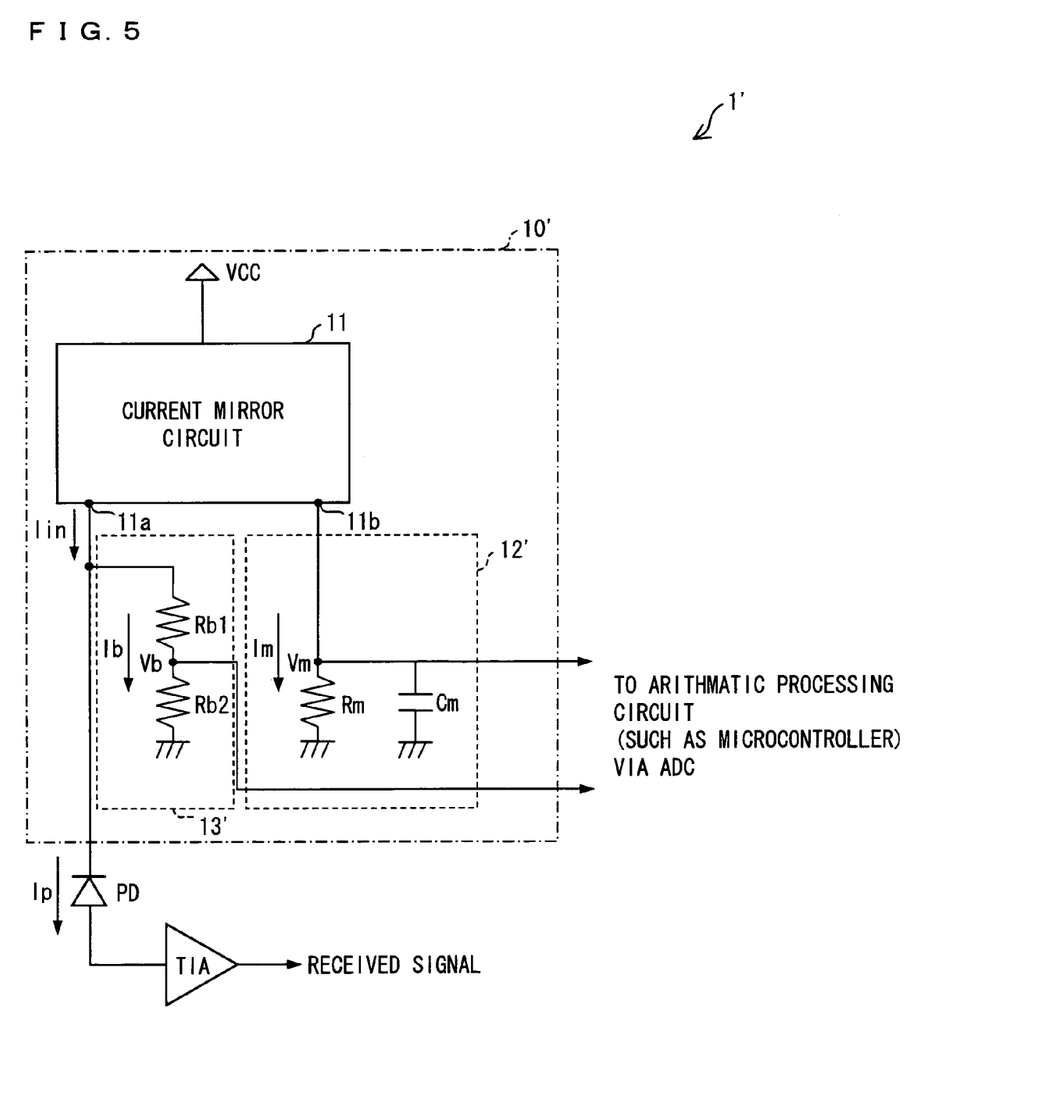
FIG. 5 is a circuit diagram illustrating an optical receiver including a monitoring circuit of the present invention, showing the second embodiment of the present invention.

The following description deals with the second embodiment of the present invention with reference to FIG. 5.

FIG. 5 is a circuit diagram illustrating an optical receiver 1' including a monitoring circuit 10' in accordance with the present embodiment. The optical receiver 1' is a burst optical signal reception device for receiving a burst optical signal, in a similar manner to the optical receiver 1 illustrated in FIG. 1. The optical receiver 1' includes a photodiode PD, and a transimpedance amplifier TIA, in addition to the monitoring circuit 10'.

FIG. 5 is a circuit diagram illustrating an arrangement of the optical receiver 1'. The optical receiver 1' includes: the photodiode PD; the transimpedance amplifier TIA connected to an anode side of the photodiode PD; and the monitoring circuit 10' connected to a cathode side of the photodiode PD (see FIG. 5).

The photodiode PD is means for converting a received optical signal into a current signal. The transimpedance amplifier TIA is means for converting the current signal obtained by the photodiode PD into a voltage signal. Various signal processing circuit (not illustrated) for processing the voltage signal obtained by the transimpedance amplifier TIA may be provided in the downstream of the transimpedance amplifier TIA.

The monitoring circuit 10' is a circuit for generating a monitor signal indicating a strength of the current signal obtained by the photodiode PD (a magnitude of a photocurrent Ip flowing across the photodiode PD), i.e. power of the received optical signal. The monitoring circuit 10' in accordance with the present embodiment includes (1) a current mirror circuit 11 having an input point 11a connected to the photodiode PD, (2) a load resistor Rb, one end of which is connected to the input point 11a of the current mirror circuit 11, and the other end of which is connected to ground, the load resistor Rb being constituted by two load resistors Rb1 and Rb2 series-connected to each other, and (3) a first output circuit 12' connected to: an output point 11b of the current mirror circuit 11; and an intermediate point between the load resistors Rb1 and Rb2. The load resistor Rb causes a standby current (offset current) of approximately several tens of µA to flow across transistors constituting the current mirror circuit 11 even outside a period of time in which an optical signal is received. A resistance value of the load resistor Rb is set to several MΩ.

The current mirror circuit 11 is the same as the current mirror circuit included in the monitoring circuit 10 in accordance with First Embodiment. Further, the monitoring circuit 10' is the same as the monitoring circuit 10 in accordance with First Embodiment in that (i) the photodiode PD is connected to the input point 11a of the current mirror circuit 11, and (ii) the input point 11a of the current mirror circuit 11 is connected to ground via the load resistor Rb.

The first output circuit 12' included in the monitoring circuit 10' in accordance with the present embodiment outputs a monitor signal indicating a monitor electric potential Vm proportional to a monitor current Im outputted from the current mirror circuit 11. Further, the monitoring circuit 10' in accordance with the present embodiment outputs, together with the monitor signal, an offset signal indicating an offset electric potential Vb proportional to an offset current Ib flowing concurrently with the monitor current. The offset signal is outputted from a second output circuit 13' which includes: the load resistor Rb1, one end of which is connected to the input point 11a of the current mirror circuit 11, and the other end of which is connected to the load resistor Rb2; and the load resistor Rb2, one end of which is connected to (the other end of) the load resistor Rb1, and the other end of which is connected to ground (see FIG. 5). The offset current Ib is converted into the offset electric potential Vb by the load resistor Rb2.

Note that the present embodiment is the same as First Embodiment in that (i) the monitor electric potential Vm is an electric potential at the output point 11b of the current mirror circuit 11 with respect to ground, and (ii) the offset electric potential Vb is an electric potential, with respect to ground, at the intermediate point between the two load resistors Rb1 and Rb2 which are connected to the input point 11a of the current mirror circuit 11.

The output circuit 12' includes a resistor Rm, one end of which is connected to the output point 11b of the current mirror circuit 11, and the other end of which is connected to ground (see FIG. 5), for example. The monitor current Im is converted into the monitor electric potential Vm by the resistor Rm. Further, the output circuit 12' may further include a capacitor Cm, one end of which is connected to the output point 11b of the current mirror circuit 11, and the other end of which is connected to ground (see FIG. 5). A capacitance of the capacitor Cm is set so as to stabilize the monitor electric potential Vm within a requested period of time.

In the output circuit 12', the monitor electric potential Vm, i.e. an electric potential at the output point 11b of the current mirror circuit 11, is proportional to the monitor current Im, as shown by Formula (9). Further, the offset electric potential Vb, i.e. an electric potential at the intermediate point between the load resistors Rb1 and Rb2, is proportional to the offset current Ib, as shown by Formula (10).

$$Vm = Rm \times Im \quad (9)$$

$$Vb = Rb2 \times Ib \quad (10)$$

Accordingly, in a case where Formula (11) is satisfied by setting each of resistance values of the load resistor Rb2 and the resistor Rm, a difference "Vm−Vb" between the monitor electric potential Vm and the offset electric potential Vb is proportional to a photocurrent Ip, as shown by Formula (12).

$$Rm:Rb2 = n:1 \quad (11)$$

$$Vm - Vb = (Rm/n) \times Ip \quad (12)$$

As described above, the output circuit 12' outputs the monitor signal indicating the monitor electric potential Vm, and the output circuit 13' outputs the offset signal indicating the offset electric potential Vb. Accordingly, by finding a difference between the value Vm of the monitor signal and the value Vb of the offset signal, it is possible to obtain a value which (i) is proportional to the photocurrent Ip flowing across the photodiode PD, and (ii) does not depend on the offset current Ib. Therefore, it is possible to accurately monitor a strength of the photocurrent Ip flowing across the photodiode PD by finding a difference between a value of the monitor signal and a value of the offset signal.

Moreover, even if a magnitude of the offset current Ib fluctuates due to a fluctuation in resistance value of the load resistor Rb, which fluctuation in resistance value is due to a fluctuation in ambient temperature or the like, such a fluctuation in magnitude of the offset current Ib has no influence on a difference between a value of the monitor signal and a value of the offset signal. Therefore, it is possible to realize a temperature fluctuation compensation effect with respect to the load resistor Rb by use of an arithmetic processing circuit for subtracting a value of the offset signal from a value of the monitor signal.

Conclusion of Second Embodiment

As described above, a monitoring circuit in accordance with the present embodiment includes: a current mirror circuit for outputting a monitor current proportional to an input current, the current mirror circuit having an input point for receiving the input current, the input point being connected to a photodetector; a load resistor, the load resistor and the photodetector being connected to the input point of the current mirror circuit in parallel; and an output circuit for outputting a monitor signal indicating a monitor electric potential proportional to the monitor current, the monitoring circuit outputting an offset signal together with the monitor signal, the offset signal indicating an offset electric potential proportional to an offset current flowing across the load resistor concurrently with the monitor current. In other words, the monitoring circuit includes: a current mirror circuit for outputting a monitor current proportional to an input current, the current mirror circuit having an input point for receiving the input current, the input point being connected to a photodetector and a load resistor, which are connected thereto in parallel; a first output circuit for outputting a monitor signal indicating a monitor electric potential proportional to the monitor current; and a second output circuit for outputting an offset signal indicating an offset electric potential proportional to an offset current which flows across the load resistor concurrently with the monitor current.

Further, a method in accordance with the present embodiment, for outputting a monitor signal, employing a monitoring circuit including: a current mirror circuit for outputting a monitor current proportional to an input current, the current mirror circuit having an input point for receiving an input current, the input point being connected to a photodetector; and a load resistor, the load resistor and the photodetector are connected to the input point of the current mirror circuit in parallel, includes the step of outputting an offset signal together with a monitor signal indicating a monitor electric potential proportional to the monitor current, the offset signal indicating an offset electric potential proportional to an offset current which flows across the load resistor concurrently with the monitor current. In other words, the method for outputting a monitor signal, includes: generating a monitor current proportional to an input current by use of a current mirror circuit having an input point for receiving the input current, the input point being connected to a photodetector and a load resistor, which are connected thereto in parallel; outputting a monitor signal indicating a monitor electric potential proportional to the monitor current; and outputting an offset signal indicating an offset electric potential proportional to an offset current which flows across the load resistor concurrently with the monitor signal.

According to the arrangement, the current mirror circuit receives the offset current (standby current) via the load resistor even outside a period of time in which an optical signal is received. This allows a quick rise of the monitor electric potential at a start point of the period f time in which an optical signal is received. Therefore, power of a burst optical signal received by use of the photodetector can be calculated on the basis of the monitor signal.

Moreover, according to the arrangement, the monitor signal indicating the monitor electric potential and the offset signal indicating the offset electric potential are outputted. Therefore, it is possible to obtain a difference between a value of the monitor signal and a value of the offset signal, which difference is proportional to the photocurrent flowing across the photodetector, and does not depend on a magnitude of the offset current flowing across the load resistor.

A resistance value of the load resistor fluctuates due to a fluctuation in ambient temperature or the like. This causes a fluctuation in magnitude of the offset current flowing across the load resistor. According to the arrangement, however, such a fluctuation in magnitude of the offset current has no influence on a difference between a value of the monitor signal and a value of the offset signal. Therefore, power of an optical signal received by use of a photodetector, such as a photodiode, can be calculated accurately over a wide temperature range on the basis of a difference between a value of the monitor signal and a value of the offset signal.

[Additional Matters]

The present invention is not limited to the description of the embodiments above, but may be altered by a skilled person within the scope of the claims. An embodiment based on a proper combination of technical means disclosed in different embodiments is encompassed in the technical scope of the present invention.

INDUSTRIAL APPLICABILITY

The present invention is widely applicable to a general optical receiver for receiving an optical signal. Particularly, the present invention is suitably applicable to an optical receiver for receiving a burst optical signal. Further, the present invention is suitably applicable to, in particular, an optical receiver used outdoors.

REFERENCE SIGNS LIST 1, 1'. Optical receiver
PD. Photodiode
TIA. Transimpedance amplifier
10, 10'. Monitoring circuit
11. Current mirror circuit
11a. Input point
11b. Output point
12. Output circuit
12'. Output circuit (first output circuit)
13'. Output circuit (second output circuit)
Rb1, Rb2. Load resistor
Im, Vm. Monitor current, monitor electric potential
Ib, Vb. Offset current, offset electric potential

The invention claimed is:

1. A monitoring circuit comprising:
a current mirror circuit for outputting a monitor current proportional to an input current, the current mirror circuit having an input point for receiving the input current, the input point being connected to a photodetector and a load resistor, which are connected thereto in parallel; and
an output circuit for outputting a monitor signal indicating a difference between a monitor electric potential proportional to the monitor current, and an offset electric potential proportional to an offset current which flows across the load resistor concurrently with the monitor current, wherein the current mirror circuit has a current mirror ratio equal to a ratio of a resistance value of a resistor for converting the monitor current into the monitor electric potential to a resistance value of a resistor for converting the offset current into the offset electric potential.

2. The monitoring circuit as set forth in claim 1, wherein:
the output circuit is a differential amplifier circuit which receives the monitor electric potential as a noninverting input, and the offset electric potential as an inverting input.

3. The monitoring circuit as set forth in claim 1, wherein:
the output circuit is a differential amplifier circuit which receives the monitor electric potential as a noninverting input, and the offset electric potential as an inverting input.

4. A method for outputting a monitor signal, the method comprising:
generating a monitor current proportional to an input current by use of a current mirror circuit having an input point for receiving the input current, the input point being connected to a photodetector and a load resistor, which are connected thereto in parallel; and
outputting a monitor signal indicating a difference between a monitor electric potential proportional to the monitor current, and an offset electric potential proportional to an offset current which flows across the load resistor concurrently with the monitor current, wherein the current mirror circuit configured to generate the monitor signal has a current mirror ratio equal to a ratio of a resistance value of a resistor for converting the monitor current into the monitor electric potential to a resistance value of a resistor for converting the offset current into the offset electric potential.

5. An optical receiver comprising:
a photodetector; and
a monitoring circuit,
the monitoring circuit including:
a current mirror circuit for outputting a monitor current proportional to an input current, the current mirror circuit having an input point for receiving the input current, the input point being connected to the photodetector and a load resistor, which are connected thereto in parallel; and an output circuit for outputting a monitor signal indicating a difference between a monitor electric potential proportional to the monitor current, and an offset electric potential proportional to an offset current which flows across the load resistor concurrently with the monitor current, wherein the current mirror circuit has a current mirror ratio equal to a ratio of a resistance value of a resistor for converting the monitor current into the monitor electric potential to a resistance value of a resistor for converting the offset current into the offset electric potential.

6. A monitoring circuit comprising:

a current mirror circuit for outputting a monitor current proportional to an input current, the current mirror circuit having an input point for receiving the input current, the input point being connected to a photodetector and a load resistor, which are connected thereto in parallel in parallel;

a first output circuit for outputting a monitor signal indicating a monitor electric potential proportional to the monitor current; and a second output circuit for outputting an offset signal indicating an offset electric potential proportional to an offset current which flows across the load resistor concurrently with the monitor current, wherein the current mirror circuit has a current mirror ratio equal to a ratio of a resistance value of a resistor for converting the monitor current into the monitor electric potential to a resistance value of a resistor for converting the offset current into the offset electric potential.

7. A method for outputting a monitor signal, the method comprising:

generating a monitor signal proportional to an input current by use of a current mirror circuit having an input point for receiving the input current, the input point being connected to a photodetector and a load resistor, which are connected thereto in parallel;

outputting a monitor signal indicating a monitor electric potential proportional to the monitor current; and outputting an offset signal indicating an offset electric potential proportional to an offset current which flows across the load resistor concurrently with the monitor current, wherein the current mirror circuit configured to generate the monitor signal has a current mirror ratio equal to a ratio of a resistance value of a resistor for converting the monitor current into the monitor electric potential to a resistance value of a resistor for converting the offset current into the offset electric potential.

8. An optical receiver comprising:

a photodetector; and a monitoring circuit, the monitoring circuit including:

a current mirror circuit for outputting a monitor current proportional to an input current, the current mirror circuit having an input point for receiving the input current, the input point being connected to the photodetector and a load resistor, which are connected thereto in parallel;

a first output circuit for outputting a monitor signal indicating a monitor electric potential proportional to the monitor current; and a second output circuit for outputting an offset signal indicating an offset electric potential proportional to an offset current which flows across the load resistor concurrently with the monitor current, wherein the current mirror circuit has a current mirror ratio equal to a ratio of a resistance value of a resistor for converting the monitor current into the monitor electric potential to a resistance value of a resistor for converting the offset current into the offset electric potential.

* * * * *